US008336611B2

(12) United States Patent
Ouyang

(10) Patent No.: US 8,336,611 B2
(45) Date of Patent: Dec. 25, 2012

(54) ENHANCED HEAT PIPE COOLING WITH MHD FLUID FLOW

(75) Inventor: Chien Ouyang, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 573 days.

(21) Appl. No.: 12/539,344

(22) Filed: Aug. 11, 2009

(65) Prior Publication Data

US 2010/0006269 A1   Jan. 14, 2010

Related U.S. Application Data

(60) Division of application No. 11/345,762, filed on Feb. 2, 2006, now Pat. No. 7,614,445, which is a continuation-in-part of application No. 11/313,392, filed on Dec. 21, 2005, now Pat. No. 7,417,858.

(51) Int. Cl.
  *F28F 27/00* (2006.01)
  *F28D 15/00* (2006.01)
(52) U.S. Cl. .................. 165/272; 165/274; 165/104.28; 165/104.31; 165/104.33
(58) Field of Classification Search .................. 165/272, 165/274, 104.17, 104.18, 104.19, 104.22, 165/104.23, 104.26, 104.28, 104.31, 104.33
See application file for complete search history.

(56) References Cited

U.S. PATENT DOCUMENTS

| | | | |
|---|---|---|---|
| 3,532,159 A * | 10/1970 | Broadwell et al. ....... | 165/104.22 |
| 3,812,404 A | 5/1974 | Barkan et al. | |
| 4,067,237 A | 1/1978 | Arcella | |
| 4,366,857 A * | 1/1983 | Mayer ...................... | 165/104.23 |
| 4,519,447 A | 5/1985 | Wiech, Jr. | |
| 4,524,587 A * | 6/1985 | Kantor ....................... | 165/86 |
| 4,967,831 A * | 11/1990 | Leland ..................... | 165/104.25 |
| 5,005,639 A * | 4/1991 | Leland ..................... | 165/104.25 |
| 5,144,531 A | 9/1992 | Go et al. | |
| 5,161,090 A * | 11/1992 | Crawford et al. ........... | 361/700 |
| 5,339,214 A | 8/1994 | Nelson | |
| 5,355,942 A | 10/1994 | Conte | |
| 5,365,749 A | 11/1994 | Porter | |
| 5,533,567 A | 7/1996 | Van Putten et al. | |
| 5,880,524 A | 3/1999 | Xie | |
| 5,978,220 A | 11/1999 | Frey et al. | |
| 6,019,165 A | 2/2000 | Batchelder | |
| 6,658,861 B1 * | 12/2003 | Ghoshal et al. ................ | 62/3.7 |
| 6,708,501 B1 * | 3/2004 | Ghoshal et al. ................ | 62/3.7 |
| 6,766,817 B2 | 7/2004 | da Silva | |
| 6,856,037 B2 * | 2/2005 | Yazawa et al. ............... | 361/700 |
| 6,918,404 B2 | 7/2005 | Dias da Silva | |
| 6,942,018 B2 | 9/2005 | Goodson et al. | |
| 7,066,586 B2 | 6/2006 | da Silva | |
| 7,131,286 B2 * | 11/2006 | Ghoshal et al. ................ | 62/3.7 |
| 7,143,648 B2 | 12/2006 | Pristup | |
| 7,245,495 B2 * | 7/2007 | Ouyang ................... | 165/104.33 |
| 7,265,977 B2 | 9/2007 | Martin et al. | |

(Continued)

*Primary Examiner* — Ljiljana Ciric
(74) *Attorney, Agent, or Firm* — Osha Liang LLP

(57) ABSTRACT

A heat source is cooled by employing heat pipes, magneto-hydrodynamic fluid pipes, and a heat sink. Heat is transmitted from evaporating ends of the heat pipes connected to the heat source to condensing ends of the heat pipes connected to the heat sink. The magneto-hydrodynamic fluid is circulated inside the magneto-hydrodynamic fluid pipes. Magnetic fields are generated using an array of magnets and an electric potential is created from a top surface to a bottom surface of each magneto-hydrodynamic fluid pipe using metal films. The magnetic fields and electric potential induce an electrically-conductive magneto-hydrodynamic fluid to circulate in the magneto-hydrodynamic fluid pipes thereby dissipating heat from the heat sink.

8 Claims, 18 Drawing Sheets

U.S. PATENT DOCUMENTS

| | | | |
|---|---|---|---|
| 7,340,904 B2 * | 3/2008 | Sauciuc et al. | 62/3.2 |
| 7,466,553 B2 * | 12/2008 | Hamman | 62/3.2 |
| 7,614,445 B2 * | 11/2009 | Ouyang | 165/272 |
| 7,621,319 B2 * | 11/2009 | Ouyang | 165/104.33 |
| 7,870,893 B2 * | 1/2011 | Ouyang et al. | 165/104.33 |
| 2002/0046825 A1 | 4/2002 | Huang et al. | |
| 2002/0143225 A1 | 10/2002 | Kagitani | |
| 2004/0234379 A1 | 11/2004 | Miner et al. | |
| 2004/0234392 A1 * | 11/2004 | Ghoshal et al. | 417/410.1 |
| 2005/0145371 A1 * | 7/2005 | DiStefano et al. | 165/104.21 |
| 2005/0160752 A1 | 7/2005 | Ghoshal et al. | |
| 2006/0045755 A1 * | 3/2006 | McDonald et al. | 417/50 |
| 2008/0279698 A1 | 11/2008 | Bau | |

* cited by examiner

ENHANCED HEAT PIPE COOLING WITH MHD FLUID FLOW

CROSS-REFERENCE TO RELATED APPLICATIONS

This application is a divisional application and claims benefit under 35 U.S.C. §120 of U.S. patent application Ser. No. 11/345,762, filed on Feb. 2, 2006, entitled "Enhanced Heat Pipe Cooling With MHD Fluid Flow," in the name of Chien Ouyang.

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate."

"Heat sinks" are devices that are commonly used to cool integrated circuits. FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection."

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air. Efficient cooling approaches are critical to the performance and reliability of an IC device with significant power consumption.

SUMMARY

According to one aspect of one or more embodiments of the present invention, a cooling apparatus of an IC package comprises: integrated circuits with one or more heat sources, a heat pipe base covering the surface of one or more heat sources, a plurality of heat pipes connecting the heat pipe base and a heat pipe condenser, a heat sink with heat sink fins connected to the heat pipe condenser, and a magnet array pump assembly with magneto-hydrodynamic (MHD) fluid pipes inside the heat sink.

According to another aspect of one or more embodiments of the present invention, a method of cooling a plurality of integrated circuits comprises: attaching a heat pipe base to a heat source, wherein a surface of the heat pipe base completely covers a surface of the heat source; connecting a plurality of heat pipes containing fluid to the heat pipe base; evaporating the fluid from first ends of the plurality of heat pipes connected to the heat pipe base; condensing the fluid at second ends of the plurality of heat pipes connected to a heat sink; and cooling the heat sink by circulating MHD fluid inside MHD pipes embedded in the heat sink.

Other aspects and advantages of the invention will be apparent from the following description and the appended claims.

DETAILED DESCRIPTION

Figure 1:
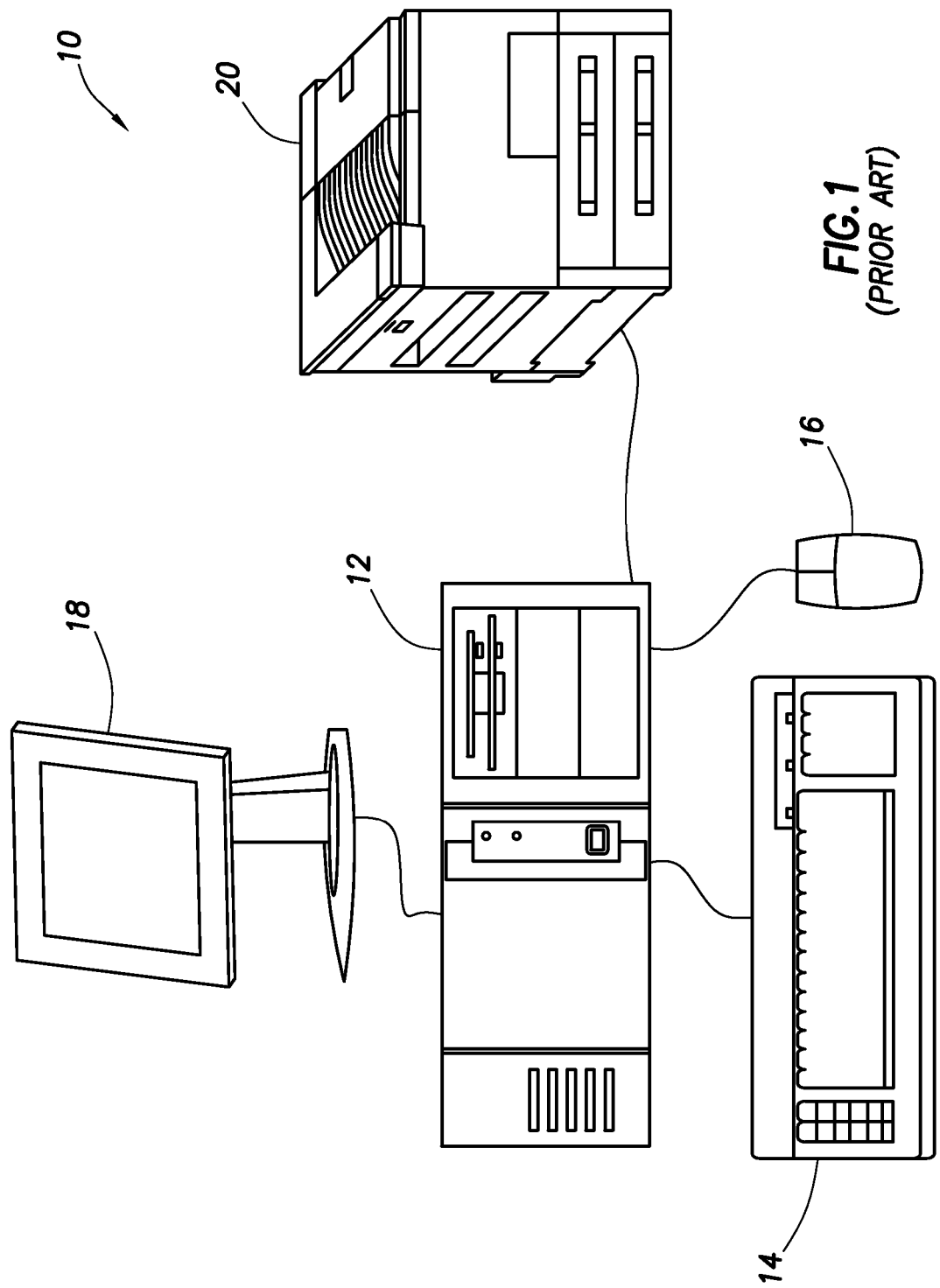
FIG. 1 shows a computer system.
Figure 2:
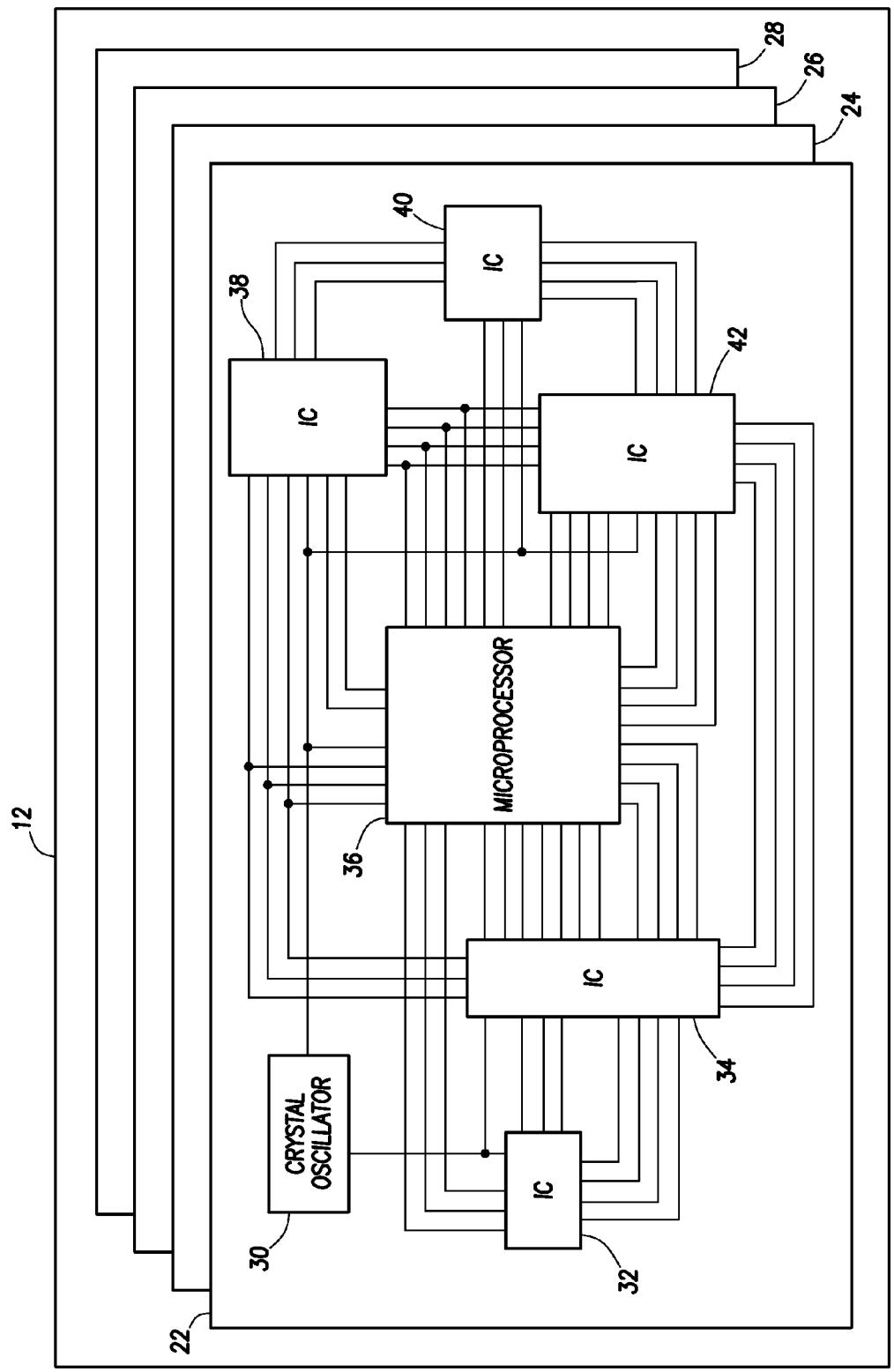
FIG. 2 shows a portion of a computer system.
Figure 3:
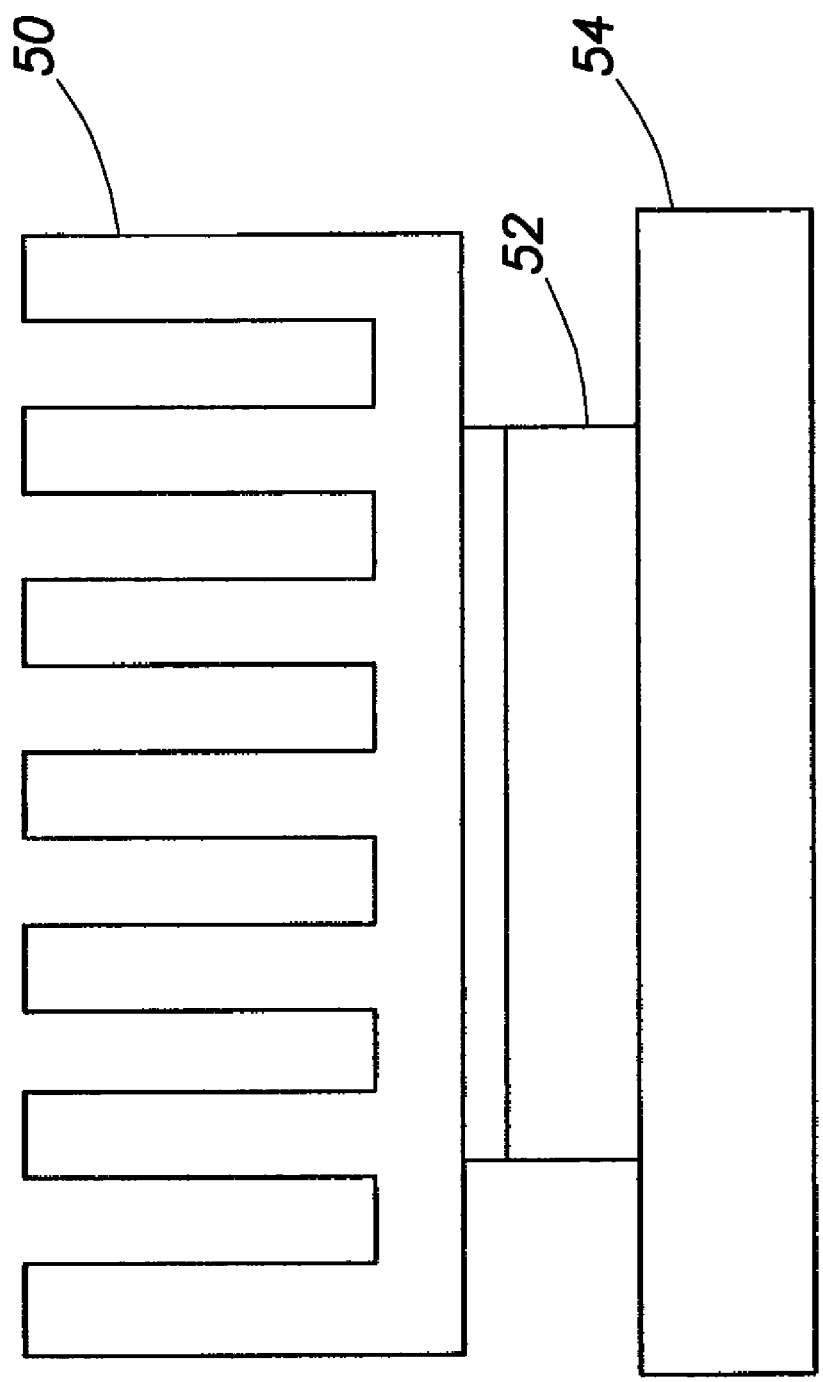
FIG. 3 shows a heat sink as used with an integrated circuit.

As described above with reference to FIG. 3, a typical heat sink is arranged to cool a singly integrated circuit. However, on a circuit board (e.g., circuit board 22 shown in FIG. 2), there are typically multiple integrated circuits. While an individual heat sink could be used for every integrated circuit that is desired to be cooled, in one or more embodiments of the present invention, a cooling apparatus uses a multiple magnet array to control fluid flow for cooling multiple integrated circuits. The multiple magnet array controls fluid flow dependent on magnetic fields generated in the multiple magnet array. Such cooling is referred to herein as "magneto-hydrodynamic" cooling.

Specific embodiments of the invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the invention. In other instances, well-known features have not been described in detail to avoid obscuring the description of embodiments of the present invention.

Figure 4A:
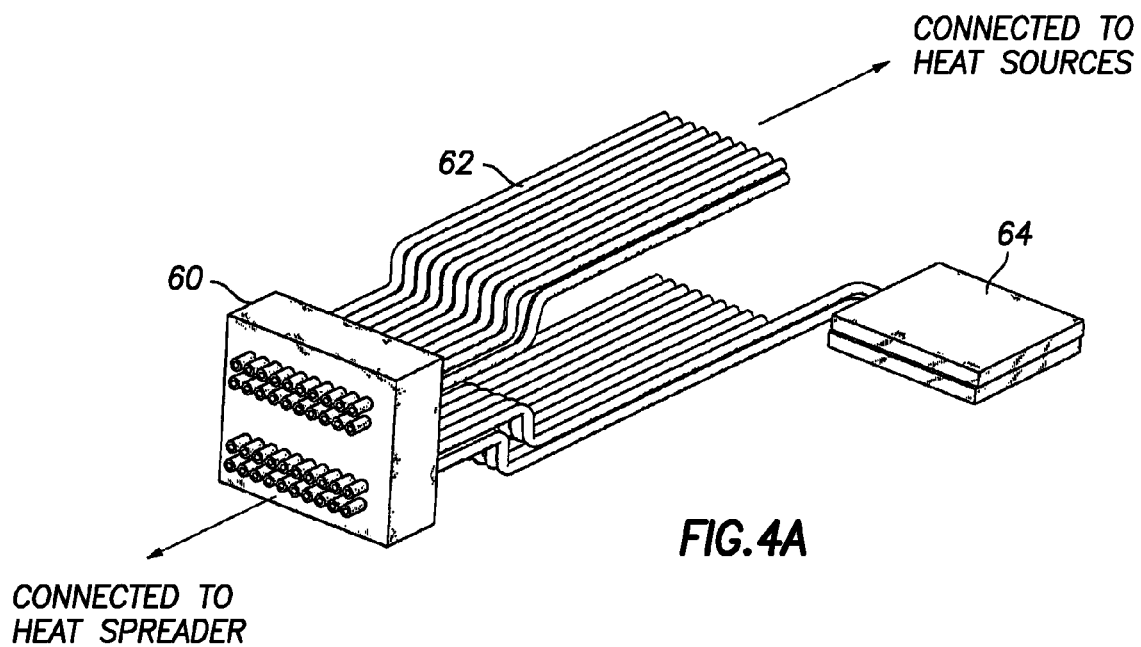
FIG. 4A shows a portion of a heat sink in accordance with an embodiment of the present invention.
Figure 4B:
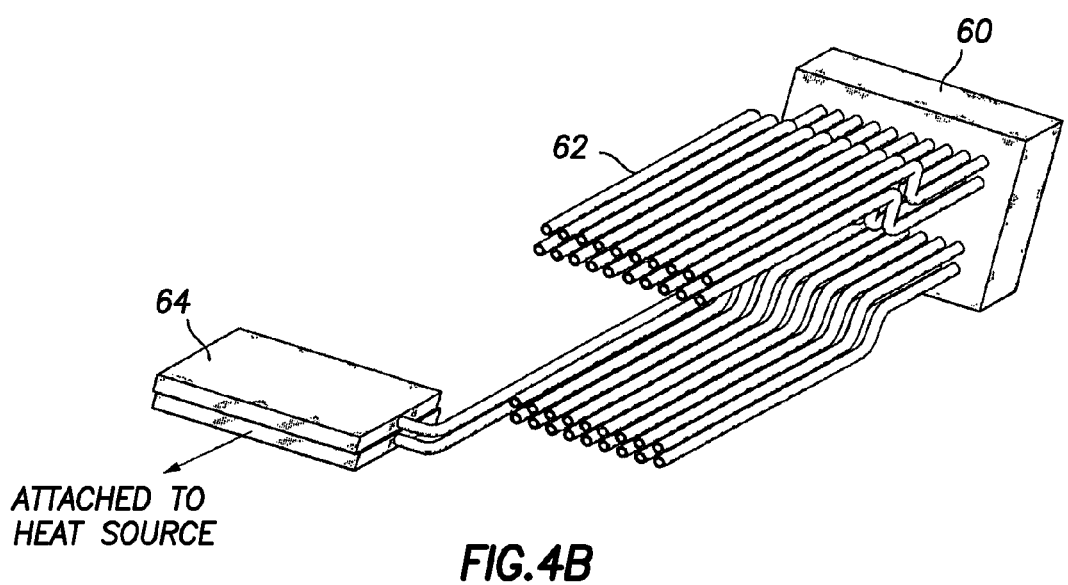
FIG. 4B shows a portion of a cooling apparatus in accordance with an embodiment of the present invention.

FIGS. 4A and 4B show portions of a cooling apparatus in accordance with one or more embodiments of the present invention. In FIG. 4A, a multiple magnet array 60 is operatively connected to several groups (or "levels") of magneto-hydrodynamic pipes 62. The multiple magnet array 60 is arranged to control the flow of fluid in the magneto-hydrodynamic pipes 62 between a heat spreader (or "heat exchanger") (e.g., a copper body having a plurality of fins to dissipate heat) (not shown) and one or more heat sources (e.g., integrated circuits).

Further, as shown in FIGS. 4A and 4B, groups of the magneto-hydrodynamic pipes 62 may be operatively connected to an individual heat sink 64 that is attached to a heat source desired to be cooled. The individual heat sink 64 may be arranged to at least temporarily pool fluid delivered for cooling an attached heat source. Accordingly, those skilled in the art will note that the individual heat sink 64 may have a cavity for pooling fluid. In such a manner, differing volumes of fluid may be delivered to the individual heat sink 64 for cooling of the attached heat source.

Figure 5:
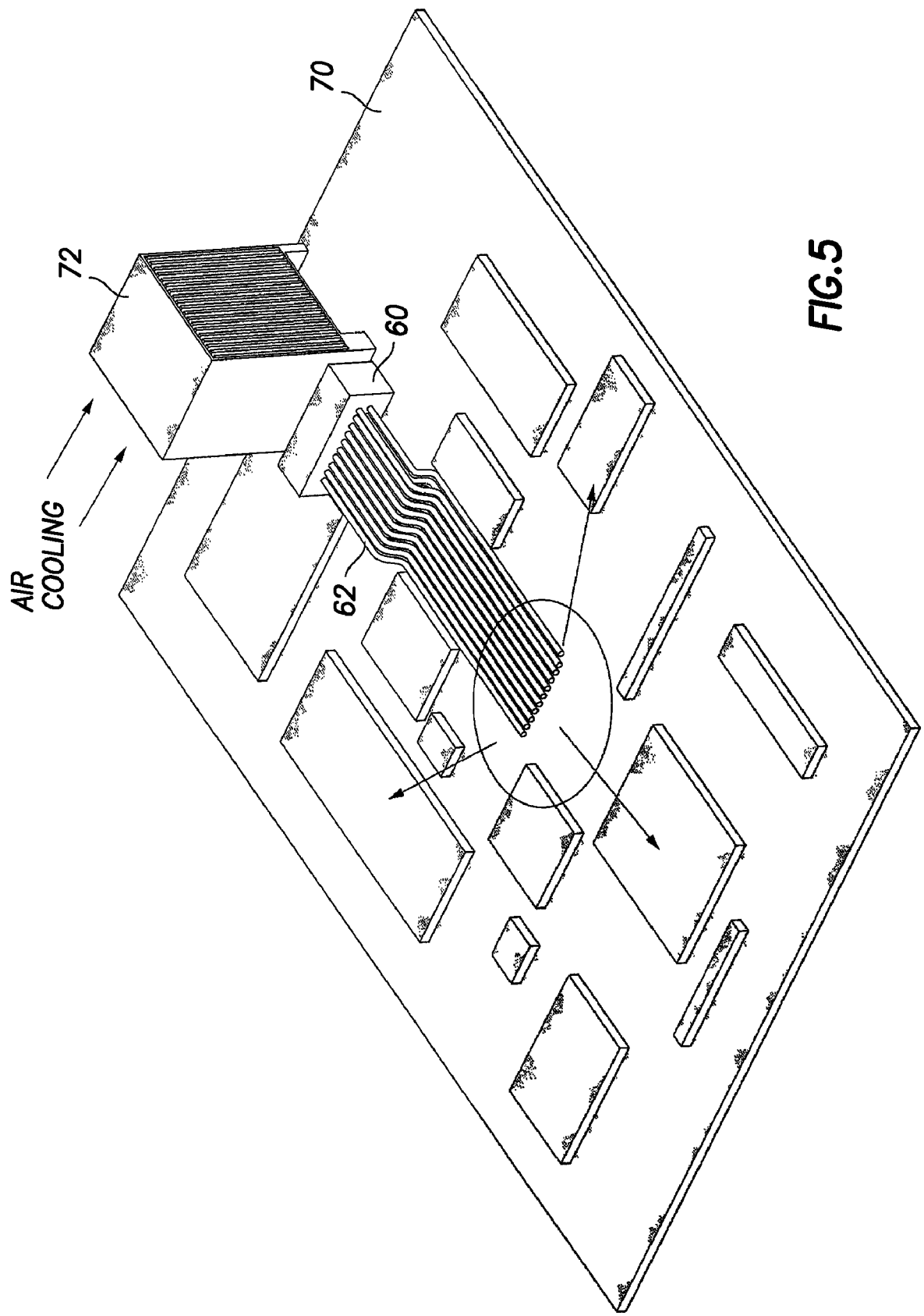
FIG. 5 shows a cooling apparatus in accordance with an embodiment of the present invention.

FIG. 5 shows an example of a cooling apparatus in accordance with an embodiment of the present invention. Particularly, FIG. 5 shows a cooling apparatus as it is implemented on a circuit board 70. The multiple magnet array 60 is operatively connected to the magneto-hydrodynamic pipes 62. The multiple magnet array 60 is also operatively connected to or attached to a heat sink cooling fins 72. The heat sink cooling fins 72 is arranged to dissipate heat as air is passed through the heat sink cooling fins 72 (an example of a direction of air flow through the heat sink cooling fins 72 is indicated by the corresponding arrows shown in FIG. 5).

Fluid carried by the magneto-hydrodynamic pipes 62 may be directed to one or more integrated circuits (shown, but not labeled) disposed on the circuit board 70. Further, certain groups of the magneto-hydrodynamic pipes 62 are arranged to carry heated fluid away from one or more integrated circuits (shown, but not labeled) disposed on the circuit board 70.

Figure 6A:
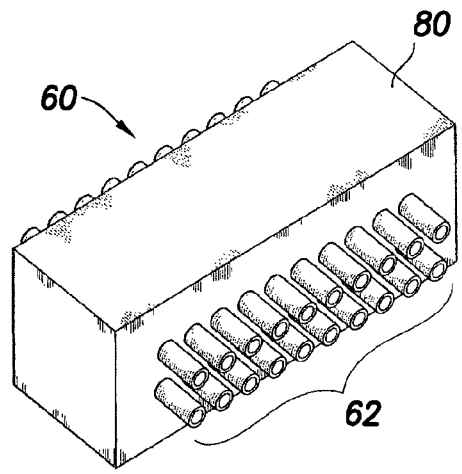
FIG. 6A shows a portion of a cooling apparatus in accordance with an embodiment of the present invention.

FIG. 6A shows a portion of a cooling apparatus in accordance with an embodiment of the present invention. Particularly, FIG. 6A shows an example of the multiple magnet array 60. The multiple magnet array 60, as described above, is arranged to generate a plurality of magnetic fields. Accordingly, the multiple magnet array 60 may be housed in a ferromagnetic metal piece 80 arranged to at least partially shield the plurality of magnetic fields. Those skilled in the art will note that such shielding may eliminate or at least reduce magnetic interference with other components (e.g., integrated circuits).

Figure 6B:
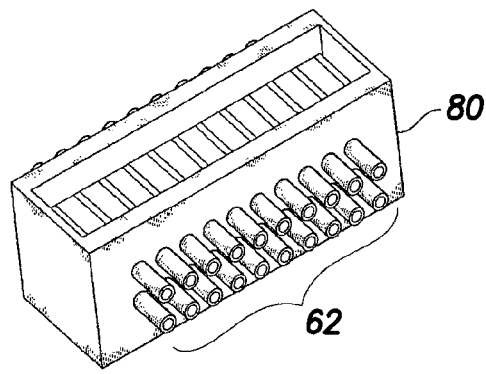
FIG. 6B shows a portion of a cooling apparatus in accordance with an embodiment of the present invention.
Figure 6C:
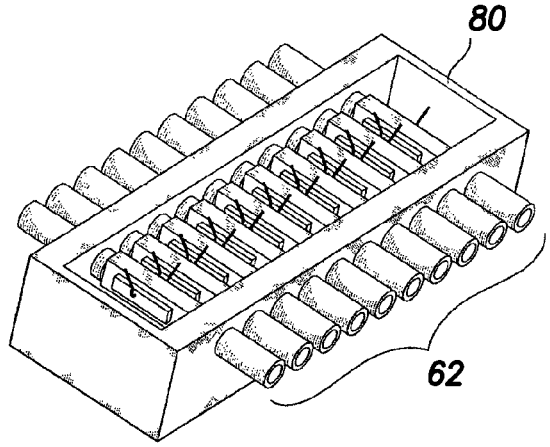
FIG. 6C shows a portion of a cooling apparatus in accordance with an embodiment of the present invention.
Figure 6D:
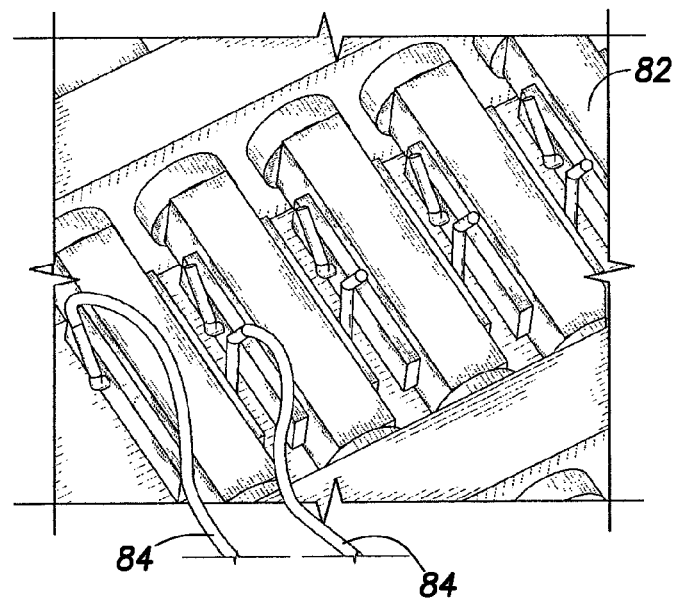
FIG. 6D shows a portion of a cooling apparatus in accordance with an embodiment of the present invention.

FIGS. 6B, 6C, and 6D shows interior portions of the multiple magnet array 60. Within the ferromagnetic metal piece 80, each of the magneto-hydrodynamic pipes 62 has an electrically non-conductive segment 82. For example, in one or more embodiments of the present invention, a segment of a magneto-hydrodynamic pipe 62 within the confines of the ferromagnetic metal piece 80 may be formed of plastic.

Now, as most clearly shown in FIG. 6D, a first electrical conductor (shown, but not labeled) is disposed along a portion of each of the electrically non-conductive segments 82. A second electrical conductor (shown, but not labeled) is disposed along another portion of each of the electrically non-conductive segments 82. Connected to each first electrical conductor (shown, but not labeled) and each second electrical conductor (shown, but not labeled) are wires 84. The wires 84 may be used to carry current to or apply voltage to a connected first or second electrical conductor. In one or more embodiments of the present invention, the first electrical conductors (shown, but not labeled) and the second electrical conductors (shown, but not labeled) may be formed of, for example, copper.

Figure 7:
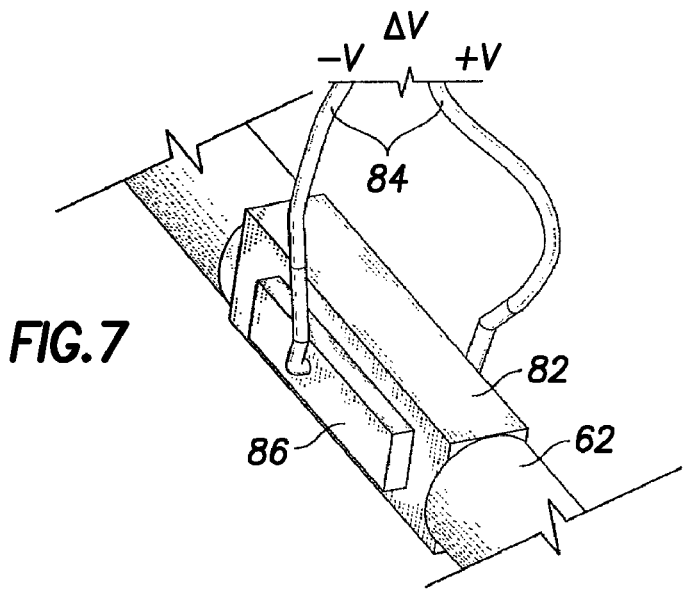
FIG. 7 shows a portion of a cooling apparatus in accordance with an embodiment of the present invention.

For purposes of clarity, FIG. 7 shows an example of an individual magneto-hydrodynamic pipe 62 and electrically non-conductive segment 82 that is housed in a multiple magnet array. In FIG. 7, a first electrical conductor 86 is attached to a portion of the electrically non-conductive segment 82. A second electrical conductor (not shown) is attached to another portion of the electrically non-conductive segment 82.

Figure 8:
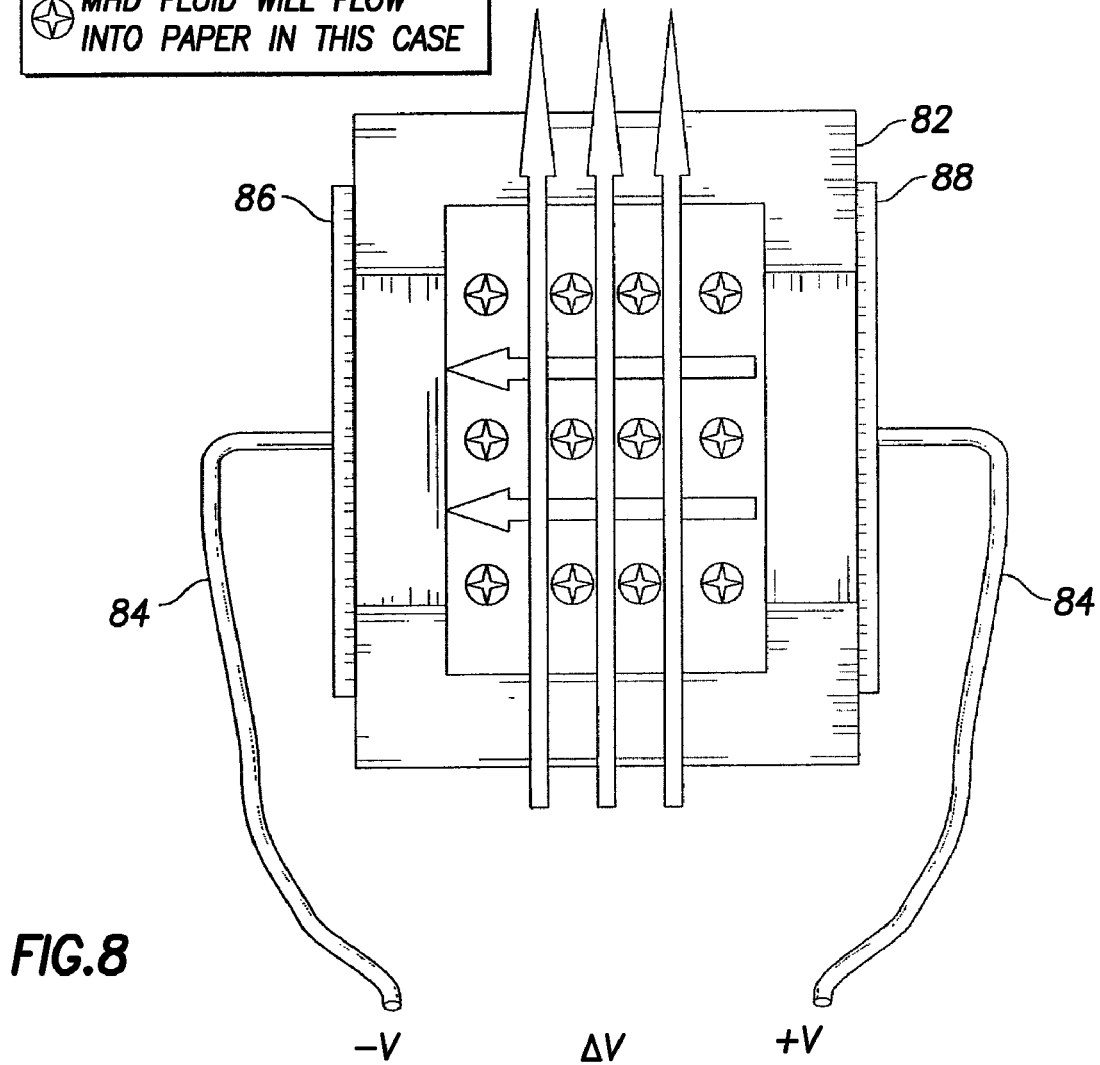
FIG. 8 shows a portion of a cooling apparatus in accordance with an embodiment of the present invention.

Now referring to FIG. 8, the wires 84 connected to each of the first electrical conductor 86 and the second electrical conductor 88 are used to create a voltage potential difference between the first electrical conductor 86 and the second electrical conductor 88. Those skilled in the art will note that such a voltage potential difference may be created by causing one of the first electrical conductor 86 and the second electrical conductor 88 to have a voltage higher than that of the other of the first electrical conductor 86 and the second electrical conductor 88. As shown in FIG. 8, the second electrical conductor 88 is caused to have a higher voltage than the first electrical conductor 86, thereby inducing electrical current flow from the second electrical conductor 88 to the first electrical conductor 86 (direction of induced electrical current flow indicated by the right-to-left arrows shown in FIG. 8).

Further, based on an arrangement of magnets within a multiple magnet array, a magnetic field is also induced across the electrically non-conductive segment 82 shown in FIG. 8. For example, in FIG. 8, a magnetic field is induced across the electrically non-conductive segment 82 in a direction indicated by the up-pointing arrows shown in FIG. 8. Accordingly, a direction of electrically conductive fluid flowing through the electrically non-conductive segment 82, and consequently, through the corresponding magneto-hydrodynamic pipe 62, is dependent on a direction of the induced electrical current and a direction of the magnetic field. As shown in FIG. 8, the direction of the induced electrical current and the direction of the magnetic field causes fluid to flow into a plane of the sheet showing FIG. 8.

Further, the rate of fluid flow in a magneto-hydrodynamic pipe 62 may be controlled by adjusting a value of the electrical current induced across the fluid in the corresponding electrically non-conductive segment 82 of the magneto-hydrodynamic pipe 62. Further still, the rate of fluid flow in a magneto-hydrodynamic pipe 62 may be controlled by adjusting a strength or orientation of the magnetic field induced across the fluid in the corresponding electrically non-conductive segment 82 of the magneto-hydrodynamic pipe 62.

Figure 9:
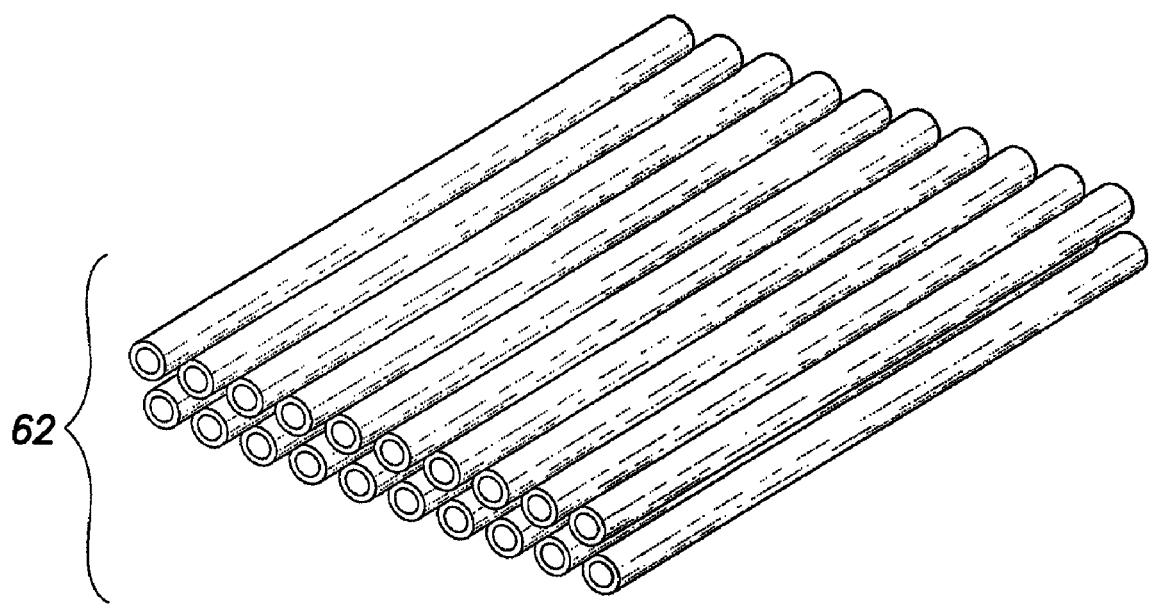
FIG. 9 shows a portion of a cooling apparatus in accordance with an embodiment of the present invention.

As described above, a multiple magnet array 60 may be used to direct fluid to and away from multiple integrated circuits. For each integrated circuit that may be cooled using the multiple magnet array 60, a set of magneto-hydrodynamic pipes 62 for carrying fluid toward the integrated circuit and a set of magneto-hydrodynamic pipes 62 for carrying fluid away from the integrated circuit are provided. An example of such sets of magneto-hydrodynamic pipes 62 is shown in FIG. 9.

Figure 10:
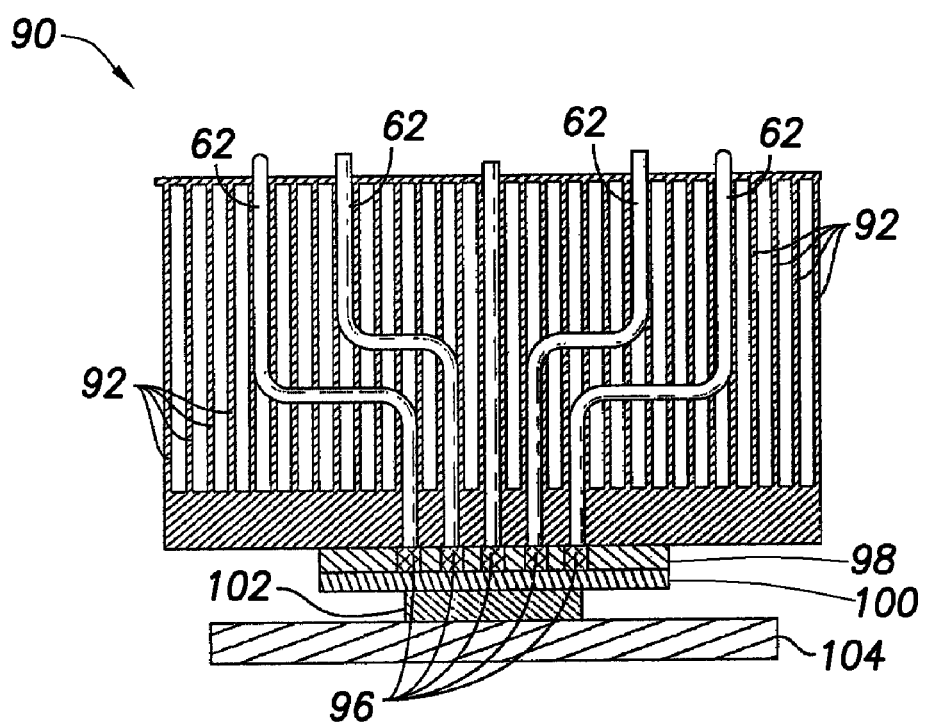
FIG. 10 shows a heat sink that may be used in accordance with an embodiment of the present invention.

The magneto-hydrodynamic pipes 62 operatively connected to the multiple magnet array 60 are each associated with a heat sink of an integrated circuit that may be cooled using the multiple magnet array 60. FIG. 10 shows an example of a heat sink 90 that may be used in accordance with an embodiment of the present invention. The heat sink 90 has a plurality of "fins" 92 allowing for and facilitating the dissipation of heat away from the heat sink 90. A plurality of magneto-hydrodynamic pipes 62 extend through the heat sink 90. Those skilled in the art will note that in one or more embodiments of the present invention, the magneto-hydrodynamic pipes 62 extending through the heat sink 90 may be integral with a body of the heat sink 90.

One end of each of the magneto-hydrodynamic pipes 62 is associated with a temperature sensor 96 embedded in a thermal interface material 98 disposed on a lid 100 positioned over an integrated circuit 102 and substrate 104. One another end of each of the magneto-hydrodynamic pipes 62 is operatively connected to a multiple magnet array 60 as described above.

Each temperature sensor 96 is configured to measure/sense a temperature at a particular location (or "hot spot") of the integrated circuit 102. Further, those skilled in the art will note that the sizing and arrangement of one or more of the temperature sensors 96, the thermal interface material 98, and the lid 100 may be adjusted so as to improve the accuracy of temperature measurements taken by one or more of the temperature sensors 96.

In one or more embodiments of the present invention, one or more of fins 92, magneto-hydrodynamic pipes 62, and lid 100 may be formed of a thermally conductive material. For example, one or more of fins 92, magneto-hydrodynamic pipes 62, and lid 100 may be formed of copper.

Further, in one or more embodiments of the present invention, a heat sink may have a different fin configuration than that shown in FIG. 10. Moreover, those skilled in the art will note that the heat sink 90 shown in FIG. 10 is not necessarily to scale and is not limited to a particular length, width, and/or height.

Further, although the heat sink 90 in FIG. 10 is shown as having a certain number of magneto-hydrodynamic pipes 62, in one or more other embodiments of the present invention, a different number of magneto-hydrodynamic pipes may be used.

As described above, a magneto-hydrodynamic pipe in a heat sink used with or as part of a cooling apparatus in accordance with one or more embodiments of the present invention has an end that is associated with a temperature sensor on a lid disposed over an integrated circuit. By using the temperature readings taken by the temperature sensor, a multiple magnet array of the cooling apparatus may be adjusted so as to effectuate a desired response with respect to cooling of a hot sport of a particular integrated circuit.

Figure 11:
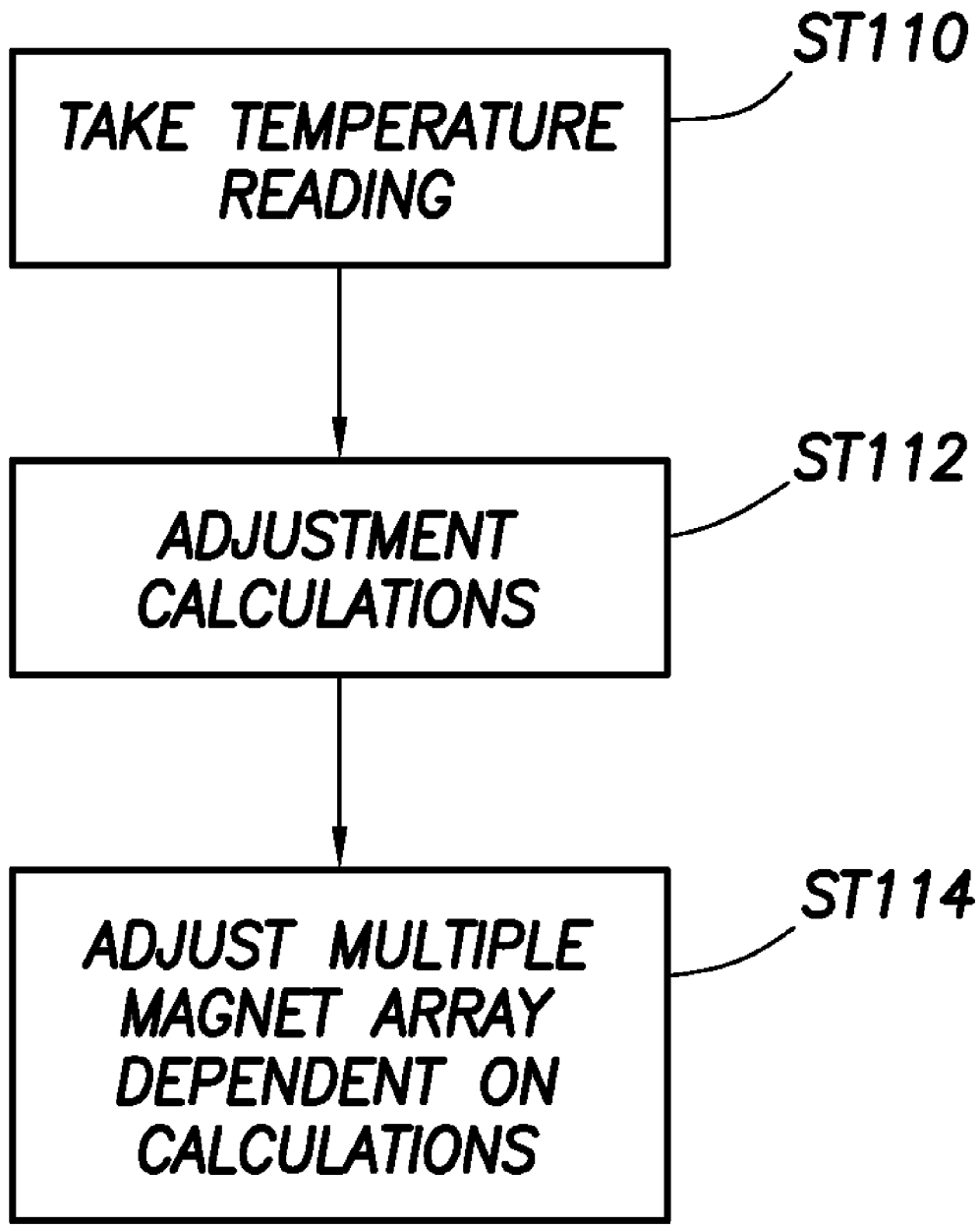
FIG. 11 shows a flow process in accordance with an embodiment of the present invention.

FIG. 11 shows an example of a flow process in accordance with an embodiment of the present invention. In FIG. 11, a temperature sensor is used to take a temperature reading at a location of an integrated circuit ST110. The temperature reading may be transmitted to, for example, a control module that calculates certain adjustments based on the temperature reading ST112. The adjustments may be made in reliance on assuming that ambient air flow conditions, cooling apparatus, and/or heat sink parameters remain constant. In such a manner, the parameters associated with a multiple magnet array of the heat sink may be adjusted without being dependent on varying ambient, heat sink, or cooling apparatus conditions.

In ST114, adjustments to the multiple magnet array of the heat sink are made based on the calculations in ST112. These adjustments may involve, for example, adjusting an electrical current induced across fluid in one or more segments in the multiple magnet array. In such a manner, the rate of fluid flow may be adjusted so as to more quickly or more slowly dissipate heat away from one or more hot spots.

Those skilled in the art will note that the control module may be any device or medium usable to make adjustment calculations. For example, the control module may be part of another integrated circuit or may be a software module executable by the integrated circuit being cooled. Further, in one or more embodiments of the present invention, a separate integrated circuit dedicated for controlling the parameters of the multiple magnet arrays may be implemented.

Figure 12:
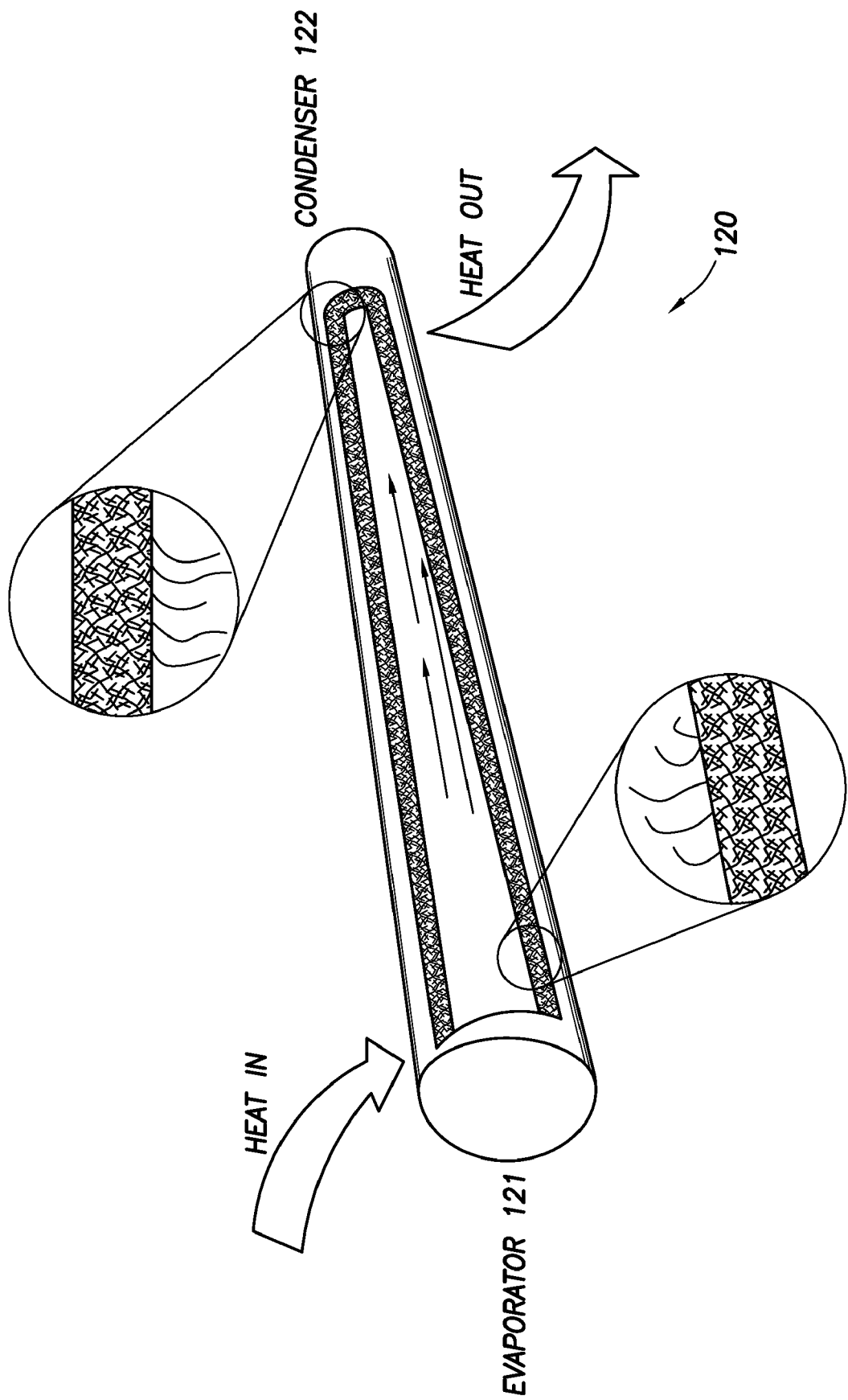
FIG. 12 shows a heat pipe with an evaporator on one end and a condenser on the other end in accordance with an embodiment of the present invention.

FIG. 12 shows an example of a heat pipe with an evaporator 121 on one end of the pipe and a condenser 122 on the opposite end. In one configuration in accordance with an embodiment of the present invention, the evaporator 121 is connected to a heat source and the condenser 122 is connected to a heat sink. A heat pipe typically comprises a vacuum tight envelope, a wick structure and a working fluid. The atmosphere inside the heat pipe is set by an equilibrium of liquid and vapor. As heat enters at the evaporator 121 on one end of the heat pipe, this equilibrium is broken, generating vapors at a slightly higher pressure. This higher pressure vapor travels to the condenser 122 located at the other end of the heat pipe where the slightly lower temperatures cause the vapor to condense, giving up its latent heat of vaporization.

Heat pipes remove heat from the source in a two-phase process. A liquid at one end of the pipe evaporates when exposed to heat and releases the heat to a heat sink by condensation at the other end. The condensed fluid is then pumped back to the evaporator by the capillary forces developed in the wick structure. This continuous cycle can transfer large quantities of heat with minimal thermal gradients. The operation of a heat pipe is passive, driven only by the heat transfer and therefore results in high reliability and durability.

Figure 13:
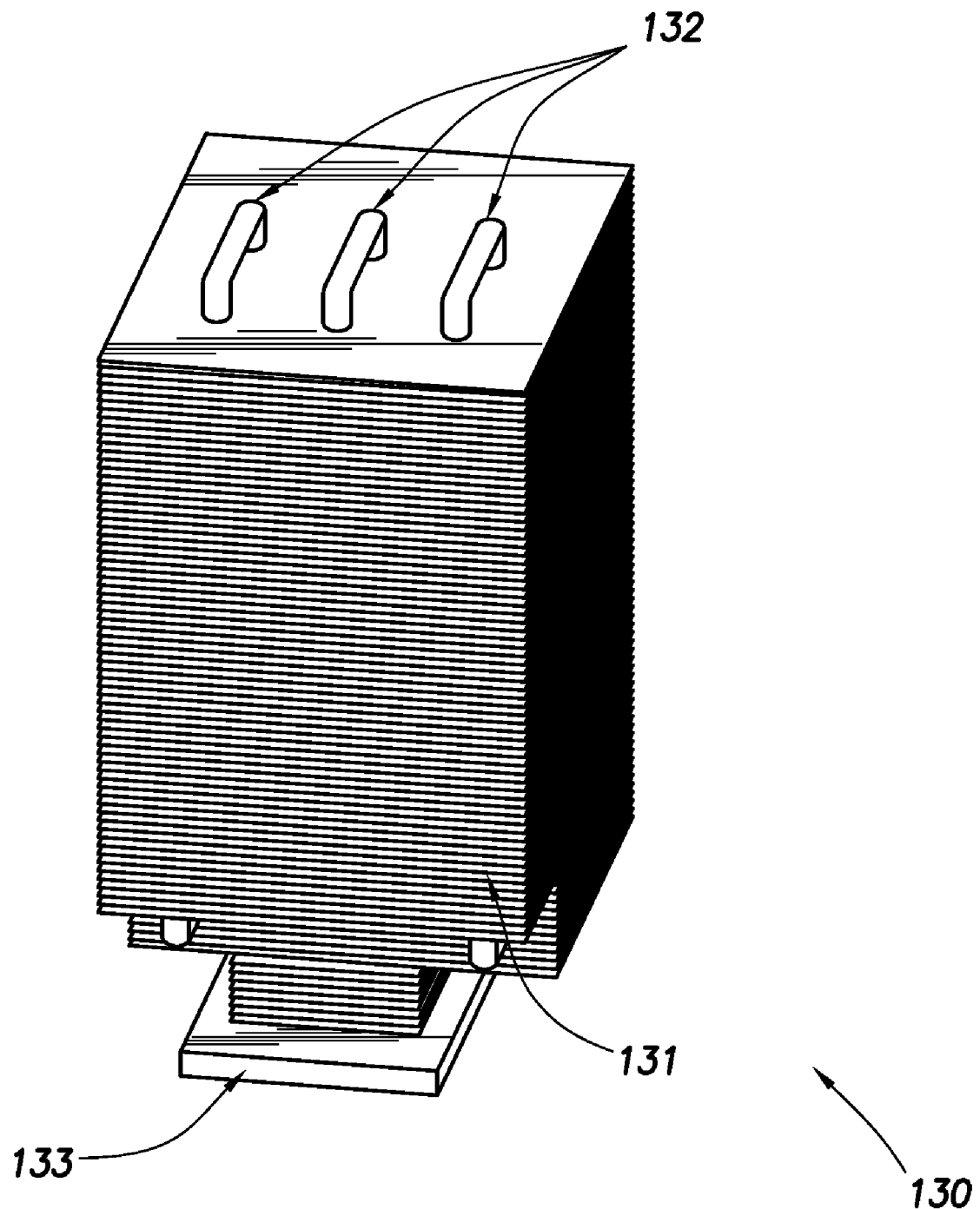
FIG. 13 shows a heat sink with a plurality of heat pipes which are placed on top of a microprocessor in accordance with an embodiment of a prior art.

FIG. 13 shows an example of heat pipes 132 embedded in heat sink fins 131. A heat spreader 133 is placed on top of a heat source such as a microprocessor. The weight of a vertical heat sink 130 with embedded heat pipes can become very heavy and cause reliability problems to the microprocessor underneath. The assembly and attachment of the vertical heat sink 130 are difficult and complex in real application.

Figure 14:
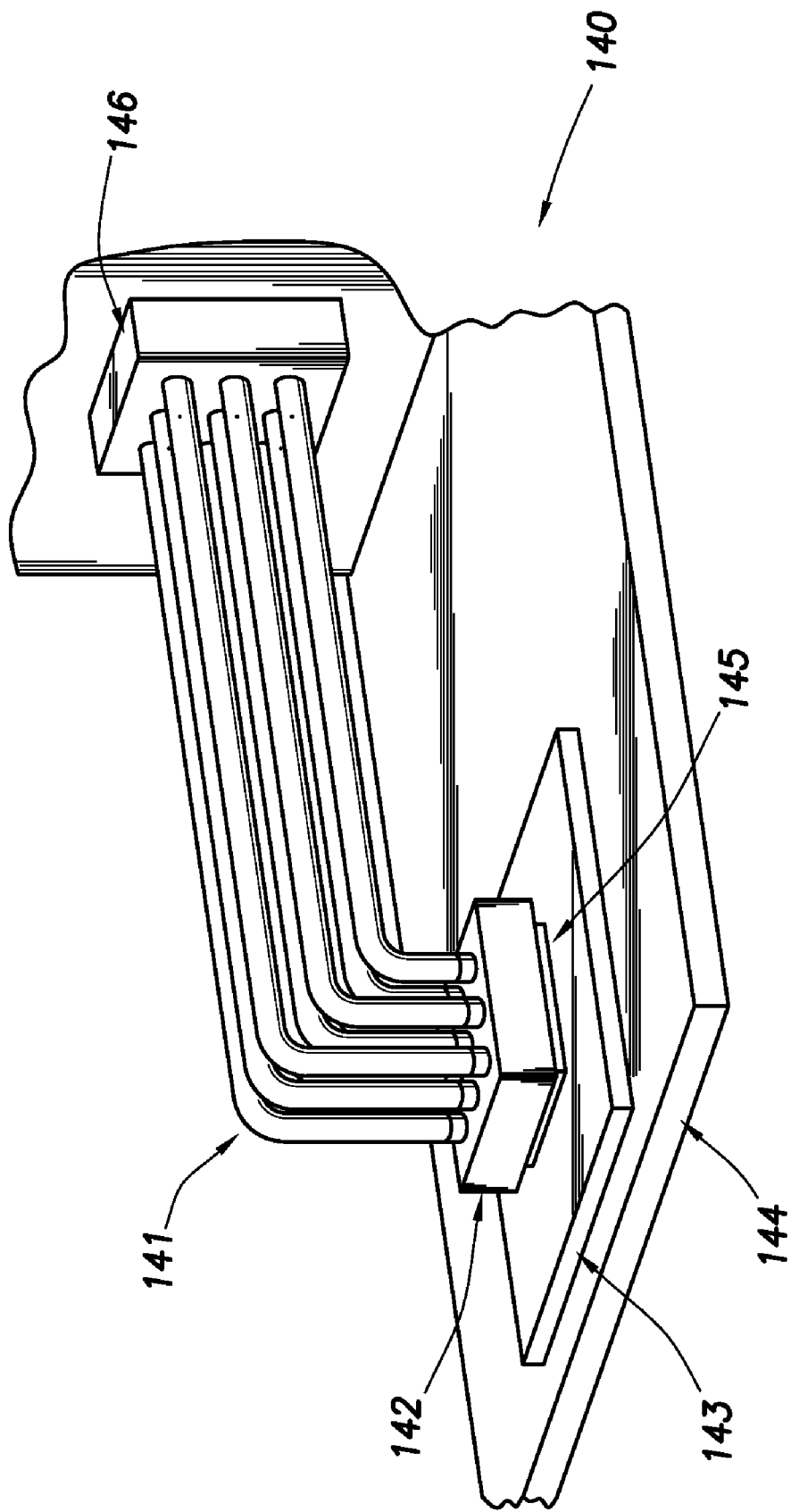
FIG. 14 shows a portion of a cooling apparatus in accordance with an embodiment of the present invention, comprising a PCB, a substrate, a heat source, a heat pipe base, a plurality of heat pipes with evaporators and condensers.

FIG. 14 shows a portion of an embodiment of the present invention. A cooling apparatus 140 on a printed circuit board 144 has a substrate 143, a heat source such as a microprocessor 145, a heat pipe base 142 which covers the top surface of the microprocessor 145, a plurality of L-shaped heat pipes 141, and a heat pipe condenser 146. The evaporator ends of the heat pipes 141 are connected to the heat pipe base 142 and the opposite ends of the heat pipes 141 are connected to the heat pipe condenser 146. Using L-shaped heat pipes reduce the burden of weight placed on the microprocessor by keeping the heat pipe condenser 146 and the heat sink with fins at a remote location. The reduction of weight greatly improves the mechanical reliability of the microprocessor 145.

Figure 15:
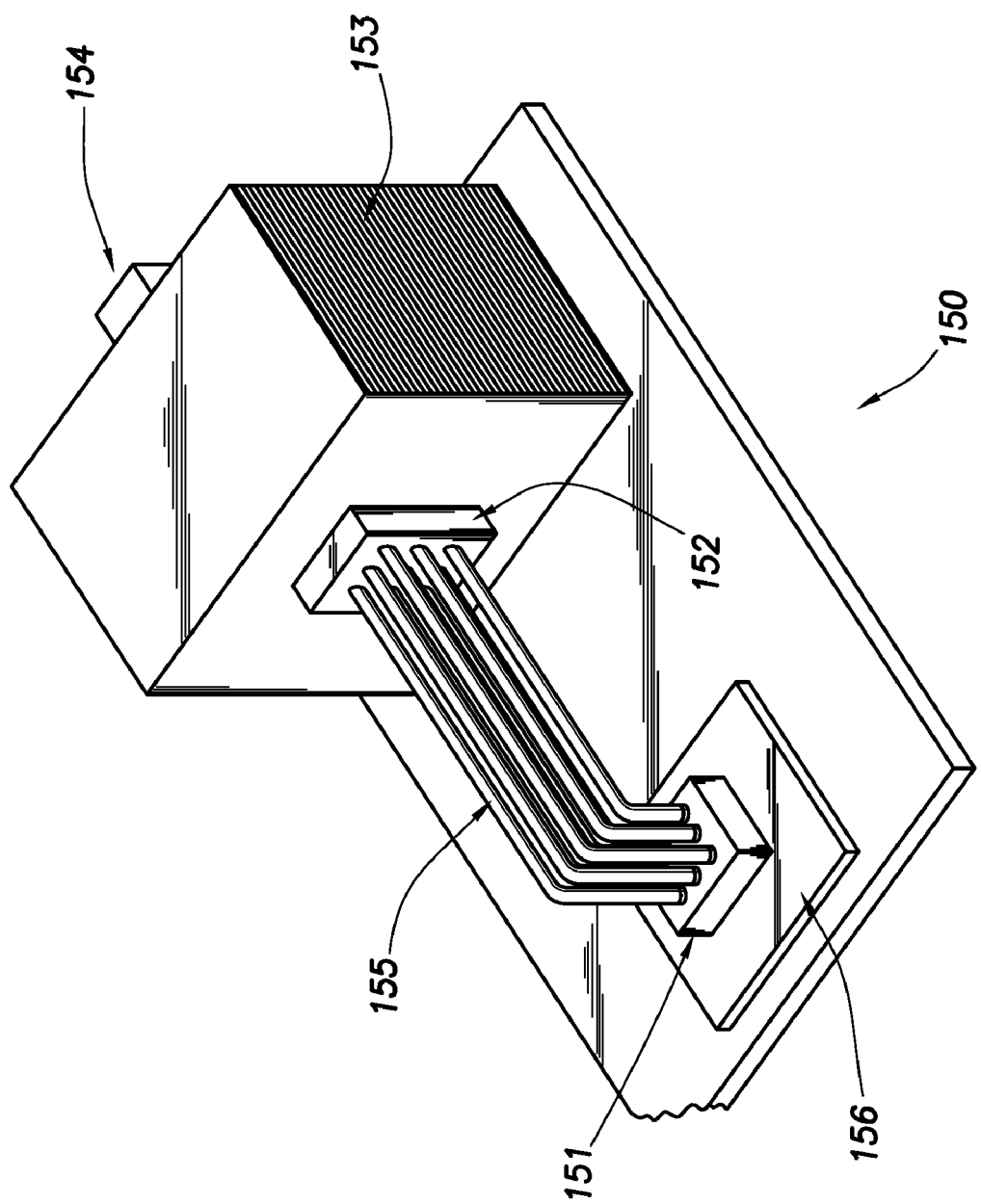
FIG. 15 shows an instance of a cooling apparatus in accordance with an embodiment of the present invention, comprising a heat source, a plurality of heat pipes with condensers and evaporators, a heat sink, a plurality of heat sink fins, and an MHD pump assembly.

FIG. 15 depicts a portion of a cooling apparatus 150 in accordance with an embodiment of the present invention. A heat source such as a microprocessor sits on top of a heat-resistant substrate 156. The heat pipe base 151 completely covers the heat source and transmits heat to a condenser 152 by vaporization and condensation of liquid contained in the heat pipes 155. A plurality of heat sink fins 153 attached to the heat pipes 155 integrate MHD pump assembly 154 and MHD pipes which are embedded in the heat sink fins. The use of embedded MHD pipes in the heat sink fins 153 significantly reduces thermal gradient and heat dissipation from the heat sink.

Figure 16:
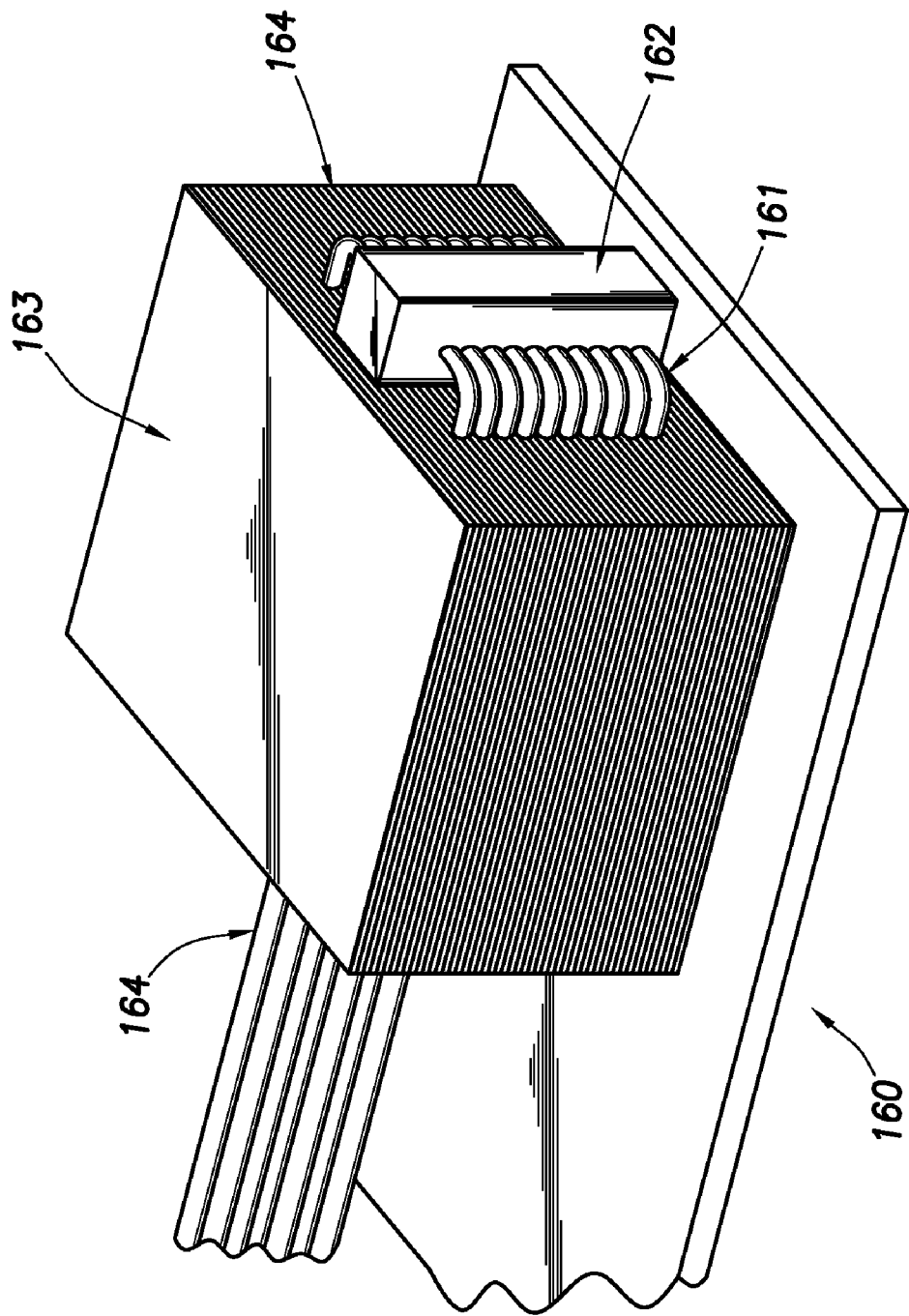
FIG. 16 shows a portion of a cooling apparatus in accordance with an embodiment of the present invention, comprising a plurality of heat pipes, a plurality of heat sink fins, a heat sink, a plurality of MHD fluid pipes, and a MHD pump assembly.

FIG. 16 displays another view of a cooling apparatus 160 in accordance with an embodiment of the present invention. A plurality of heat pipes 164 transfers heat to a heat sink 163 by condensation. MHD fluid pipes 161 are embedded in the heat sink fin structure 164 and enhance the rate of heat dissipation by providing MHD fluid circulation within the heat sink 163. An MHD pump assembly contains a plurality of magnets and metal strips to generate magnetic fields and electric potential to force or "pump" MHD fluid in a particular direction.

Figure 17:
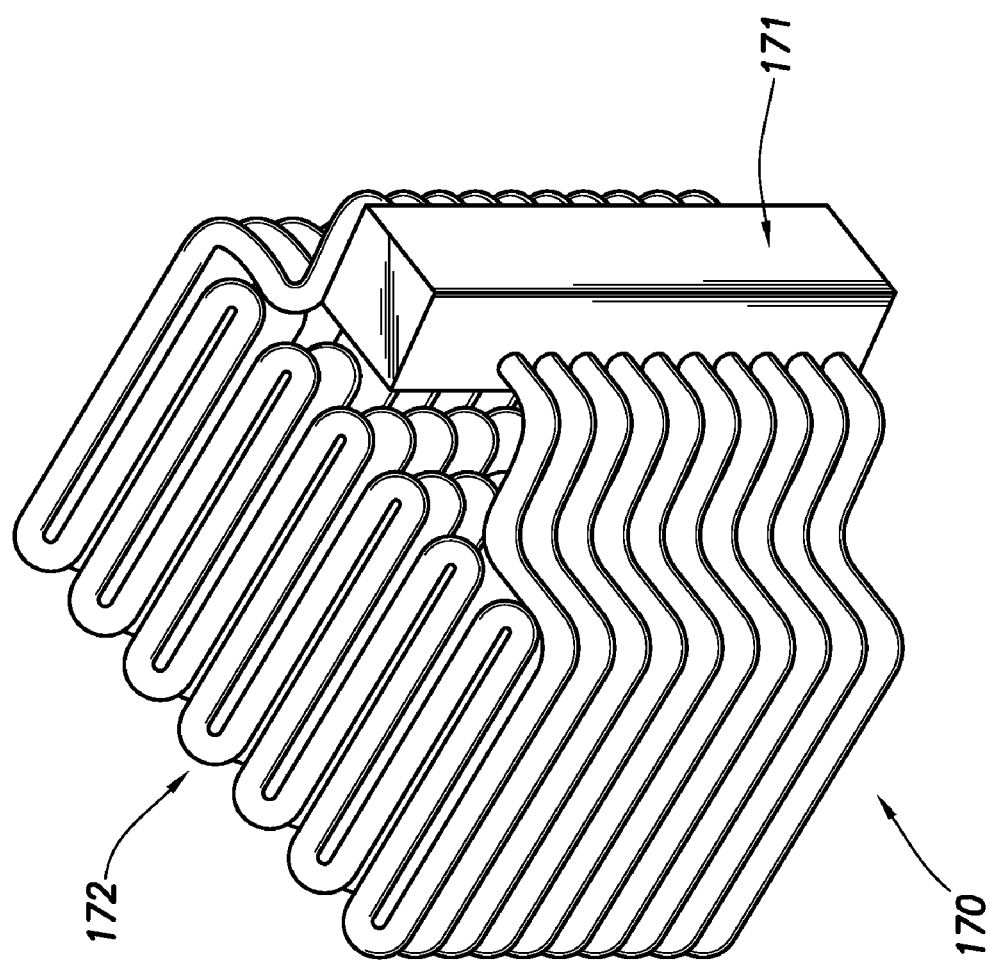
FIG. 17 shows an MHD pump assembly and MHD fluid pipes which are embedded in a heat sink in accordance with an embodiment of the present invention.

FIG. 17 shows an external view of an MHD cooling apparatus 170, taken out from the heat sink structure. A number of convoluted MHD fluid pipes 172 is connected to a ferromagnetic metal enclosure 171 containing MHD pump assembly. The ferromagnetic metal enclosure 171 prevents the MHD pump assembly from damaging other devices with magnetic field leakage. Furthermore, the convolution of pipe is designed to maximize the surface area of the plurality of pipes inside the heat sink structure for high thermal transfer. Each layer of pipe circulates MHD fluid and efficiently cools the heat sink structure.

Figure 18:
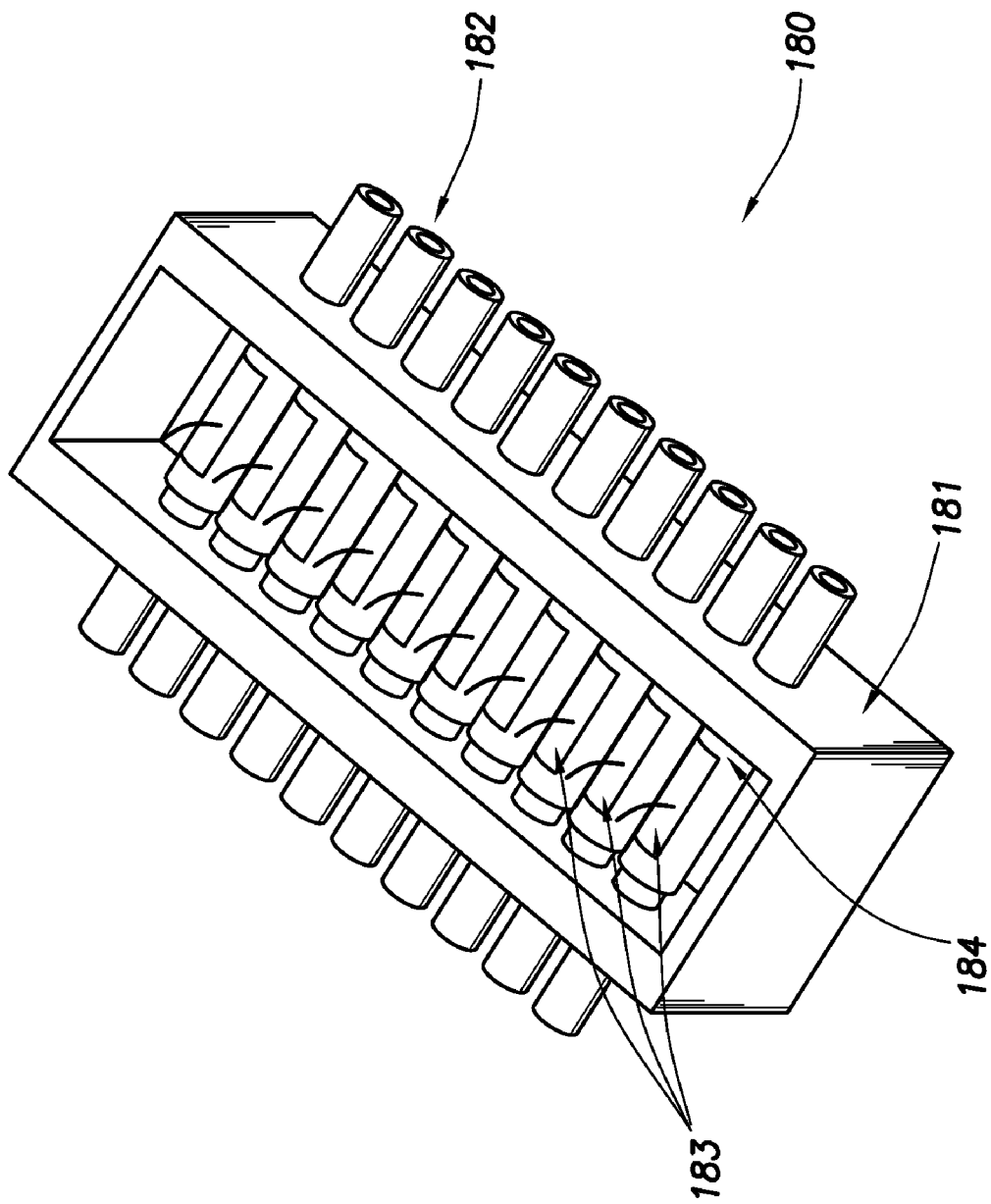
FIG. 18 shows a portion of an array of MHD fluid pipes with copper films, electrically non conductive materials between and on top of each pipe, and a ferromagnetic metal shielding cover.

FIG. 18 shows an internal view of an MHD pump assembly 180 in accordance with an embodiment of the present invention. An array of metal pipes 182 is separated from each other and sandwiched by electrically non-conductive material 184 such as plastic. Small pieces of metal films inserted to top and bottom surfaces of the non-conductive material, contacting the array of metal pipes 182 and creating an electric potential inside each pipe. In one or more embodiments of the present invention, both metal pipes and metal films are made of copper. Furthermore, magnets are placed on top and bottom of the spaces between metal pipes. A ferromagnetic metal shielding cover 181 encapsulates the MHD pump assembly to prevent damaging of other devices by magnetic field leakage.

Figure 19:
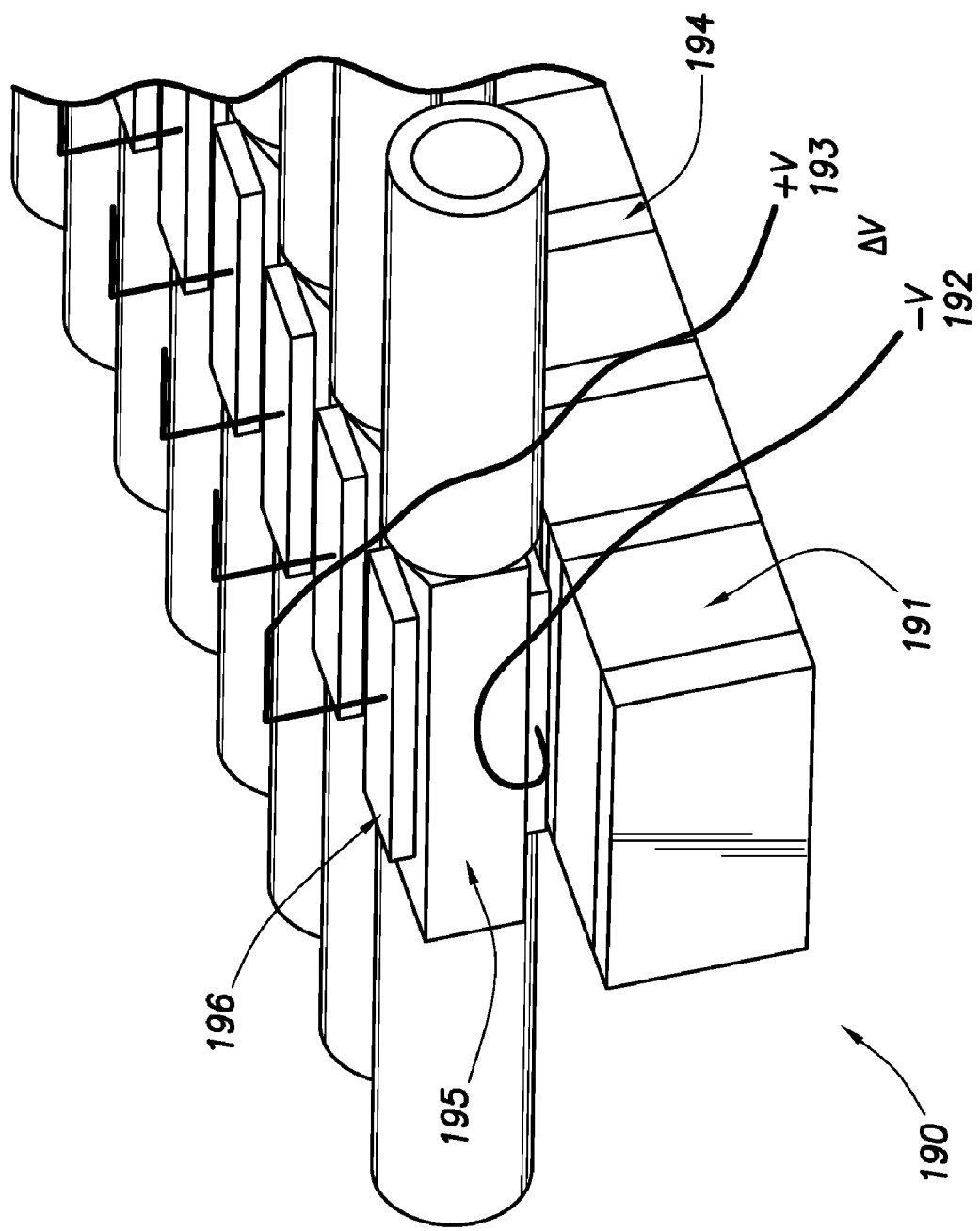
FIG. 19 shows a lateral view of a portion of a plurality of MHD fluid pipes, each sandwiched by electrically non-conductive segments and small pieces of copper film in accordance with an embodiment of the present invention.

FIG. 19 gives a detailed view of a portion of an MHD pump assembly in accordance with an embodiment of the present invention. Small pieces of metal film 196 are attached to top and bottom surfaces of an array of metal pipes and electrically non-conductive segments separate metal pipes from each other. In one or more embodiments of the present invention, a positive voltage is applied to the top metal films by an electrical wire 193 and a negative voltage is applied to the bottom metal films by an electrical wire 192. Non-metal materials 194 create gaps between segments of magnets 191. In this particular embodiment, the magnets 191 are placed above and below the spaces between metal pipes.

Figure 20:
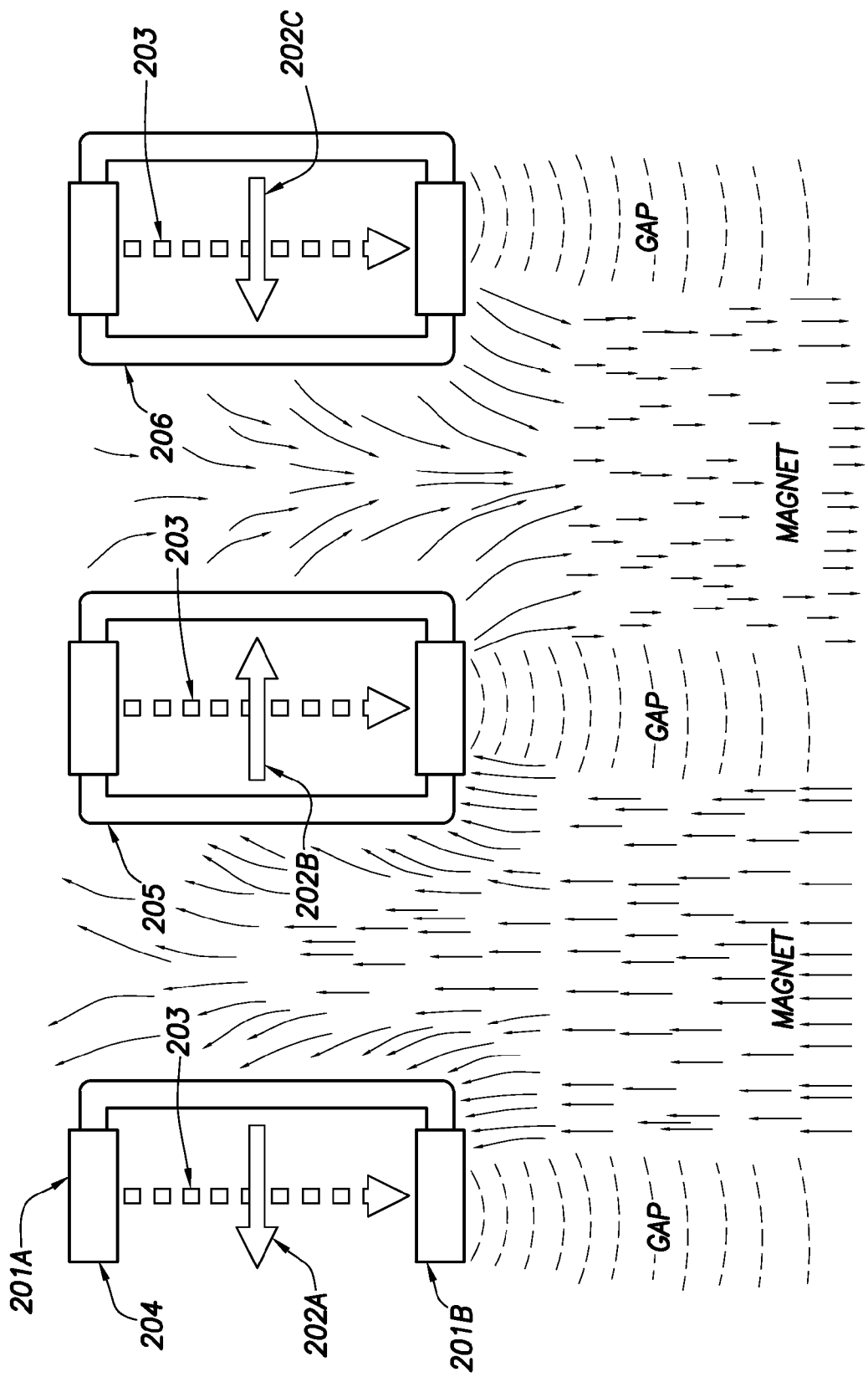
FIG. 20 shows a portion of a plurality of MHD fluid pipes in accordance with an embodiment of the present invention, with magnetic fields and an electrical current direction drawn on the figure.

FIG. 20 shows a cross-sectional view of an array of metal pipes in accordance with an embodiment of the present invention. In this particular embodiment, a top metal film 201A is positively charged and a bottom metal film 201B is negatively charged, creating an electric field 203 pointing downward. Magnets placed below the spaces between metal pipes create a counterclockwise magnetic field in pipe 204, a clockwise magnetic field in pipe 205, and a counterclockwise magnetic field in pipe 206. One skilled in the art can use the Right-Hand Rule of physics to determine the direction of force applied to MHD fluid. In the pipes 204 and 206, the downward direction of electric charge 203 and counterclockwise magnetic fields 202A and 202C create forces into the page. In the pipe 205, the clockwise direction of magnetic field 202B and the downward direction of electric charge 203 create a force out of the page. These electromagnetically induced forces will act as an MHD pump in one or more embodiments of the present invention.

Advantages of the present invention may include one or more of the following. In one or more embodiments of the present invention, a cooling apparatus may be used to cool one or more integrated circuits disposed on a circuit board.

In one or more embodiments of the present invention, a flow of thermally conductive fluid used to cool one or more hot spots of an integrated circuit may be controlled so as to effectuate a desired level of cooling.

In one or more embodiments of the present invention, a multiple magnet array for driving the flow of fluid used to cool one or more hot spots of an integrated circuit resides separate from the integrated circuit.

In one or more embodiments of the present invention, a multiple magnet array may be used to have multiple channels cool across an area of an integrated circuit, where the multiple magnet array may also be used to more directly cool a hot spot of an integrated circuit.

In one or more embodiments of the present invention, a magnetic field used to drive the flow of fluid used to cool one or more hot spots of an integrated circuit may be shielded so as to prevent magnetic field interference.

In one or more embodiments of the present invention, a plurality of heat pipes with evaporators on one end and condensers on the other end may be used to dissipate heat from one or more heat sources, wherein the condensers are connected to one or more heat sinks containing MHD fluid pipes.

In one or more embodiments of the present invention, a heat sink may be connected to a heat source by a plurality of heat pipes, wherein the heat sink does not sit on top of the heat source, hence reducing unnecessary weight placed on the heat source.

In one or more embodiments of the present invention, an MHD fluid pumping assembly with MHD pipes embedded in a heat sink may be used to decrease temperature gradient across heat sink fins.

In one or more embodiments of the present invention, a cooling apparatus comprising a plurality of heat pipes connecting one or more heat sources to a heat sink containing MHD fluid pipes provides highly efficient cooling by using both passive (heat pipes) and active (MHD fluid pipes) thermal transfer.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method for cooling a heat source with heat pipes, a plurality of magneto-hydrodynamic fluid pipes (MHD fluid pipes), and a heat sink comprising a plurality of heat sink fins, the method comprising:
   transmitting heat from evaporating ends of the heat pipes connected to the heat source to condensing ends of the heat pipes connected to the heat sink; and
   circulating magneto-hydrodynamic fluid (MHD fluid) inside the plurality of MHD fluid pipes, wherein the plurality of MHD fluid pipes are embedded in the plurality of heat sink fins to reduce a thermal gradient within the heat sink and to dissipate heat.

2. The method according to claim 1, further comprising:
   circulating the MHD fluid inside the plurality of MHD fluid pipes using an magneto-hydrodynamic pump (MHD pump) assembly.

3. The method according to claim 2, further comprising:
   shielding the MHD pump assembly with a ferromagnetic metal enclosure.

4. The method according to claim 2, further comprising:
   controlling the circulation of the MHD fluid by adjusting an electric potential applied to segments of the plurality of MHD fluid pipes in the MHD pump assembly.

5. A method for cooling a heat sink connected to a plurality of heat pipes and comprising a plurality of magneto-hydrodynamic fluid pipes (MHD fluid pipes), the method comprising:
   generating a plurality of magnetic fields using an array of magnets;
   creating an electric potential from a top surface to a bottom surface of each MHD fluid pipe using a plurality of metal films;
   inducing, by the plurality of magnetic fields and the electric potential, an electrically-conductive magneto-hydrodynamic fluid (MHD fluid) to circulate in the plurality of MHD fluid pipes; and
   dissipating heat from the heat sink.

6. The method according to claim 5, further comprising:
   at least partially shielding the plurality of magnetic fields.

7. The method according to claim 5, further comprising:
   using a directional air flow through the heat sink to accelerate the heat dissipation.

8. The method according to claim 5, further comprising:
   measuring a temperature at a location of the heat sink; and
   adjusting a flow rate of the MHD fluid circulating in the plurality of MHD fluid pipes based on the measured temperature.

* * * * *